(12) United States Patent
Luoh et al.

(10) Patent No.: US 8,669,184 B2
(45) Date of Patent: Mar. 11, 2014

(54) METHOD FOR IMPROVING FLATNESS OF A LAYER DEPOSITED ON POLYCRYSTALLINE LAYER

(75) Inventors: Tuung Luoh, Hsinchu (TW); Ling-Wu Yang, Hsinchu (TW); Ta-Hone Yang, Hsinchu (TW); Kuang-Chao Chen, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 234 days.

(21) Appl. No.: 13/012,506

(22) Filed: Jan. 24, 2011

(65) Prior Publication Data
US 2012/0190198 A1    Jul. 26, 2012

(51) Int. Cl.
*H01L 21/302*    (2006.01)
(52) U.S. Cl.
USPC ........... 438/692; 438/689; 438/690; 438/691; 257/225; 257/401; 257/411

(58) Field of Classification Search
USPC ......... 438/689, 690, 692, 257, 488, 260, 266; 257/225, 401, 411
See application file for complete search history.

(56) References Cited

U.S. PATENT DOCUMENTS

| | | | |
|---|---|---|---|
| 5,328,867 A * | 7/1994 | Chien et al. | 438/301 |
| 5,910,019 A * | 6/1999 | Watanabe et al. | 438/488 |
| 6,444,521 B1 * | 9/2002 | Chang et al. | 438/257 |
| 7,341,910 B2 * | 3/2008 | Han et al. | 438/257 |
| 7,977,172 B2 * | 7/2011 | Cho et al. | 438/151 |
| 2008/0246101 A1 * | 10/2008 | Li et al. | 257/412 |

* cited by examiner

*Primary Examiner* — Nadine Norton
*Assistant Examiner* — Maki Angadi
(74) *Attorney, Agent, or Firm* — J.C. Patents

(57) ABSTRACT

Described is a method for improving the flatness of a layer deposited on a doped polycrystalline layer, which includes reducing the grain size of the polycrystalline layer to decrease the out-diffusion amount of the dopant from the polycrystalline layer, and/or reducing the amount of the out-diffusing dopant on the surface of the polycrystalline layer.

6 Claims, 2 Drawing Sheets

METHOD FOR IMPROVING FLATNESS OF A LAYER DEPOSITED ON POLYCRYSTALLINE LAYER

BACKGROUND OF THE INVENTION

1. Field of Invention

This invention relates to a semiconductor process, and more particularly to a method for improving the flatness of a layer deposited on a doped polycrystalline layer of which the dopant tends to diffuse out and cause humps.

2. Description of Related Art

Polycrystalline materials like Poly-Si or Poly-SiGe are important semiconductor materials in various semiconductor processes, and can be in-situ doped with a p-type or n-type dopant. Sometimes an excess amount of the dopant may separate and diffuse out of the polycrystalline material along the grain boundaries, causing certain problems.

Referring to FIG. 1, a poly-Si layer 110 is deposited on a substrate 100, including many grains 112 and in-situ doped with phosphorus. Out-diffusing phosphorus 120 is present over some boundaries of the grains 112. In subsequent deposition of a silicon nitride (SiN) layer 140, SiON bumps 130 are formed over the out-diffusing phosphorus 120, so that SiN bumps 150 are formed on the SiN layer 140 lowering the accuracy of a subsequent lithography process or a pattern transfer to the poly-Si layer 110.

For example, when the poly-Si layer 110 is to be patterned into separate parallel word lines using a mask consisting of a plurality of spacers previously formed on the sidewalls of patterns of the SiN hard mask layer 140 defined by a lithography process, bridging of adjacent word lines easily occurs due to the humps 150.

SUMMARY OF THE INVENTION

Accordingly, this invention provides a method for improving the flatness of a layer deposited on a doped polycrystalline layer of which the dopant tends to diffuse out and cause humps.

The method of this invention includes reducing the grain size of the polycrystalline layer to decrease the out-diffusion amount of the dopant from the polycrystalline layer and/or reducing the amount of the out-diffusing dopant on the surface of the polycrystalline layer.

In an embodiment of this invention, the method includes reducing the grain size of the polycrystalline layer to decrease the out-diffusion amount of the dopant from the polycrystalline layer. When the polycrystalline layer comprises a poly-Si layer, the reduced grain size of the poly-Si layer may range from 20 angstroms to 500 angstroms.

In another embodiment of this invention, the method includes: reducing the grain size of the polycrystalline layer to decrease the out-diffusion amount of the dopant from the polycrystalline layer, performing a first clean step to remove the native oxide on the polycrystalline layer, and performing a second clean step to remove the out-diffusing dopant on the surface of the polycrystalline layer.

In still another embodiment of this invention, the method includes the following steps. A chemical mechanical polishing (CMP) step is performed to remove a portion of the out-diffusing dopant on the surface of the polycrystalline layer. A first clean step is performed to remove the native oxide on the polycrystalline layer. A second clean step is performing to remove the remaining out-diffusing dopant on the surface of the polycrystalline layer. The grain size of the polycrystalline layer may also be reduced in this embodiment.

By reducing the grain size of the polycrystalline layer to decrease the out-diffusion amount of the hump-causing dopant from the polycrystalline layer, the size of the humps formed on a layer deposited on the polycrystalline layer due to the dopant is reduced. As a result, the accuracy of a subsequent lithography process or that of a subsequent pattern transfer to the polycrystalline layer is less affected.

Moreover, by performing the above first and second clean steps in sequence to remove the native oxide on the polycrystalline layer and the out-diffusing dopant on the surface of the same, hump formation can be avoided substantially. Thus, the flatness of a layer deposited on the polycrystalline layer is further improved, and the accuracy of a subsequent lithography process or pattern transfer is further improved.

It is also noted that a CMP step performed to the polycrystalline layer can reduce the amount of the out-diffusing dopant on the surface thereof, so the grain size thereof is not necessarily required to reduce when CMP and the first and second clean steps are performed. However, a combination of grain size reduction and CMP is still feasible.

In order to make the aforementioned and other objects, features and advantages of this invention comprehensible, a preferred embodiment accompanied with figures is described in detail below.

DESCRIPTION OF EMBODIMENTS

This invention is further explained with the following embodiments referring to the accompanying drawings, which are not intended to limit the scope of this invention. For example, although the polycrystalline layer includes poly-Si in the embodiments, it may alternatively include another polycrystalline material like poly-SiGe. Though the dopant tending to diffuse out and cause humps is phosphorus in the embodiments, it can be any other dopant tending to diffuse out and cause humps, such as arsenic (As).

Figure 2:
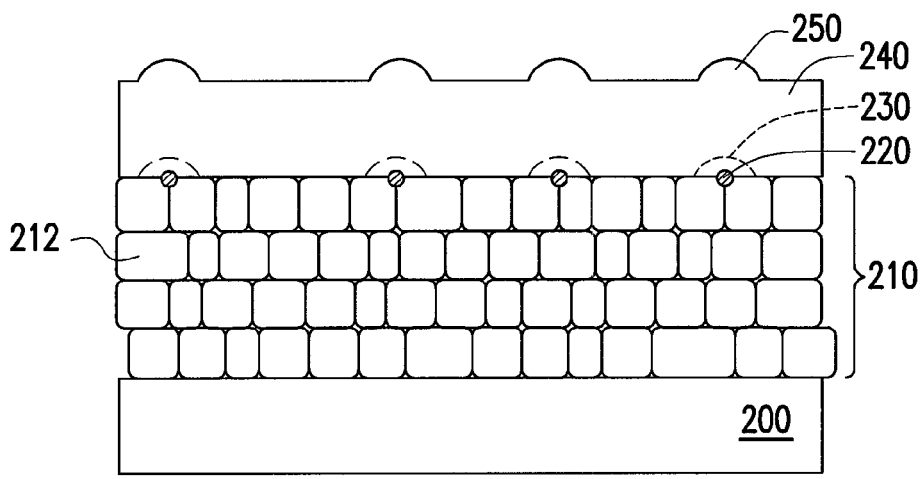
FIG. 2 illustrates a method for improving the flatness of a layer deposited on a doped polycrystalline layer according to a first embodiment of this invention.

FIG. 2 illustrates a method for improving the flatness of a layer deposited on a doped polycrystalline layer according to the first embodiment of this invention, which includes reducing the grain size of the polycrystalline layer.

Figure 1:
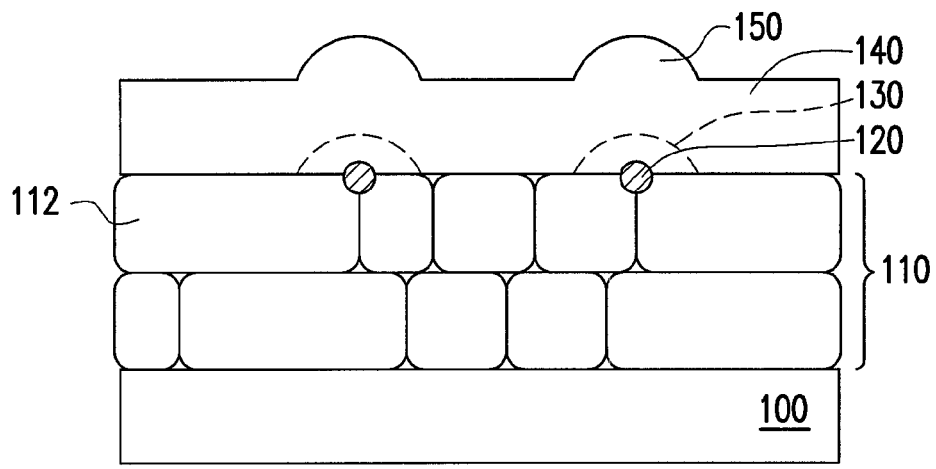
FIG. 1 illustrates the mechanism of the hump formation on a SiN layer deposited on a doped poly-Si layer in the prior art.

Referring to FIG. 2, a poly-Si layer 210 is deposited on a substrate 200, including a plurality of crystalline grains 212 smaller than the grains 112 of the poly-Si layer 110 formed in the prior art as shown in FIG. 1, and in-situ doped with a dopant tending to diffuse out and cause humps, such as phosphorus or arsenic (As).

The reduced grain size of the poly-Si layer 210 may range from 20 angstroms to 500 angstroms. When the poly-Si layer 210 is deposited using a plurality of gases including silane and hydrogen gas ($H_2$), the sizes of the grains 212 of the poly-Si layer 210 can be controlled by adjusting the flow rate of $H_2$ in the deposition of the poly-Si layer 210. In general, the higher the $H_2$ flow rate is, the smaller the sizes of the grains 212 of the poly-Si layer 210 are. In an example, the flow rate ratio of $H_2$ to silane is 2-100, the pressure is 100-500 Torr and the temperature is 500-700° C. in the deposition of the poly-Si layer 210.

By reducing the grain size of the poly-Si layer 210, the out-diffusion amount of the hump-causing dopant 220 from the poly-Si layer 210 is decreased. Thus, during the deposition of a subsequent layer 240 on the poly-Si layer 210, the deposition rate is less increased, or a different material 230 is formed slower and hence smaller, over the boundaries of the grains 212 having the out-diffusing dopant 220 thereon. Thus, the humps 250 on the subsequent layer 240 are smaller, so that the accuracy of a subsequent lithography process or pattern transfer to the poly-Si layer 210 is less affected.

The subsequent layer 240 may be a SiN layer, while a different material 230 being SiON is formed at the initial stage of the SiN deposition in the presence of the out-diffusing phosphorus 220. When the layer 240 is a SiN hard mask layer, it will be defined by a lithography process to serve as an etching mask for patterning the poly-Si layer 210. The poly-Si layer 210 may be patterned into a plurality of gates or word lines of a memory array. The memory may be flash memory, DRAM or ROM.

The subsequent layer 240 may alternatively include a metal silicide of which the deposition rate increases with an increase of the amount of the out-diffusing phosphorus 220 on the surface of the poly-Si layer 210. The metal silicide may be tungsten silicide ($WSi_x$) or cobalt silicide ($CoSi_x$). When the layer 240 is a metal silicide layer, it will be defined by a lithography process along with the poly-Si layer 210 to serve as a part of a polycide (poly-Si+silicide) structure. The stack of the poly-Si layer 210 and the metal silicide layer 240 may be patterned into a plurality of gates or word lines of a memory array. The memory may be flash memory, DRAM or ROM.

Figure 3A:
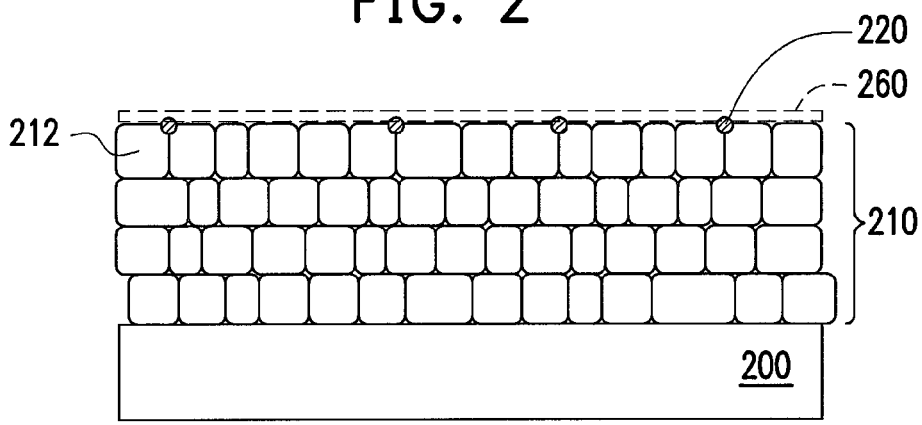
FIGS. 3A-3B illustrates a method for improving the flatness of a layer deposited on a doped polycrystalline layer according to a second embodiment of this invention.
Figure 3B:
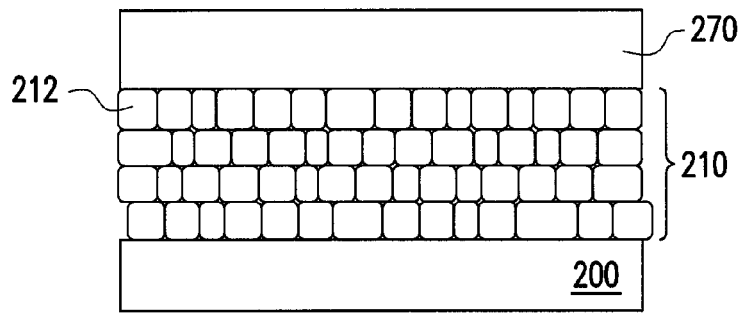

FIGS. 3A-3B illustrates a method for improving the flatness of a layer deposited on a doped polycrystalline layer according to the second embodiment of this invention, which is different from the first embodiment in that two clean steps are further included.

Referring to FIG. 3A, a first clean step is performed to remove the native oxide 260 formed on the poly-Si layer 210 with smaller grains 212, possibly using hydrofluoric acid (HF). The concentration of HF is usually 10:1 to 100:1. Thereby, the out-diffusing dopant 220 on the surface of the poly-Si layer 210 is exposed.

Referring to FIGS. 3A-3B, a second clean step is performed to remove the out-diffusing dopant 220 exposed previously. When the dopant is phosphorus, the second clean step may use hydrogen peroxide ($H_2O_2$). When $H_2O_2$ is used in the form of an aqueous solution, the concentration thereof is usually 3-50 wt %. In such case, the out-diffusing phosphorus 220 reacts with $H_2O_2$ to form removable $P_2O_5$.

For the out-diffusing dopant 220 is removed, no dopant-caused hump is formed on the layer 270 deposited on the poly-Si layer 210, and the accuracy of a subsequent lithography process or pattern transfer to the poly-Si layer 210 is not affected by such humps. The function and the material of the layer 270 may be the same as those of the layer 240 (FIG. 2) described in the first embodiment.

Figure 4A:
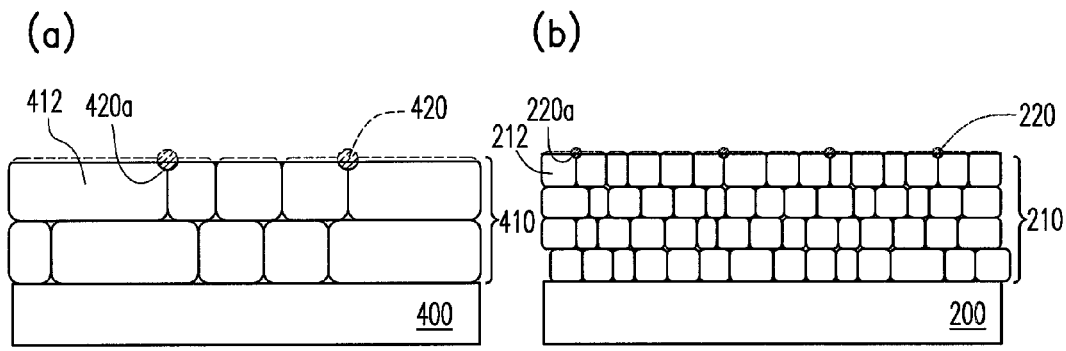
FIGS. 4A-4B illustrates a method for improving the flatness of a layer deposited on a doped polycrystalline layer according to a third embodiment of this invention, wherein the part (b)/(a) shows the case where the grain size of the polycrystalline layer is reduced/not reduced.
Figure 4B:
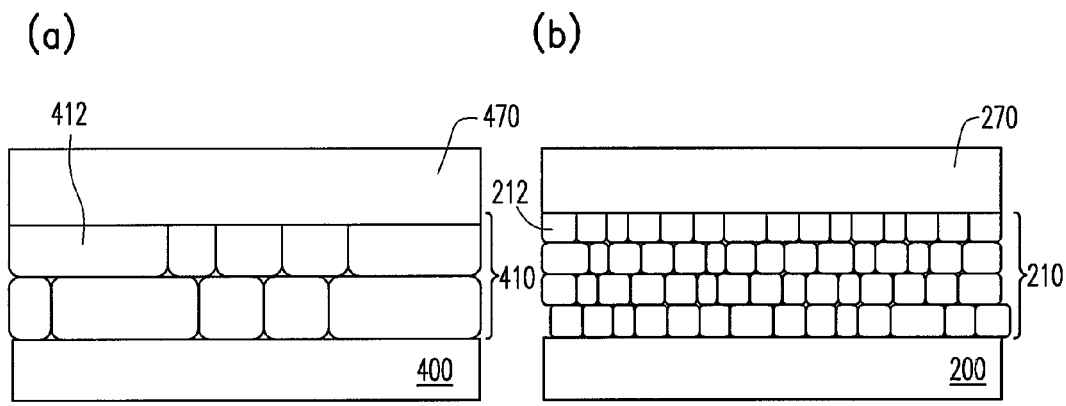

FIGS. 4A-4B illustrates a method for improving the flatness of a layer deposited on a polycrystalline layer according to the third embodiment of this invention, which is different from the second embodiment in that grain size reduction of the poly-Si layer is optional and a CMP step is added before the two clean steps.

Referring to the part (a)/(b) of FIG. 4A, a CMP step is performed to the poly-Si layer 410/210 with large/small grains 412/212 to remove a portion of the out-diffusing dopant 420/220 on the surface of the poly-Si layer 410/210, wherein a surface layer of the poly-Si layer 410/210 is also removed. The remaining out-diffusing dopant is referred to as "420a/220a". In addition, the grain size of the poly-Si layer 210 is reduced as compared to that of the poly-Si layer 410.

Referring to the part (a)/(b) of FIG. 4B, a first clean step and a second clean step as described in the second embodiment is performed to sequentially remove the native oxide and the remaining out-diffusing dopant 420a/220a on the surface of the poly-Si layer 410/210. Since a CMP step is previously performed to remove a portion of the out-diffusing dopant 420/220 on the surface of the poly-Si layer 410/210, the second clean step can be accomplished in a shorter period of time.

Because the out-diffusing dopant 420/220 is removed from the surface of the poly-Si layer 410/210, substantially no dopant-caused hump is formed on the layer 470/270 deposited on the poly-Si layer 410/210, and the accuracy of a subsequent lithography process or pattern transfer to the poly-Si layer 410/210 is not lowered by such humps. The function and the material of the layer 470/270 may be the same as those of the layer 240 (FIG. 2) described in the first embodiment.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method for improving flatness of a layer deposited on a doped polycrystalline layer, comprising:
    performing a chemical mechanical polishing (CMP) step to remove a portion of an out-diffusing dopant on a surface of the polycrystalline layer formed on a planar surface;
    performing a first clean step to remove native oxide on the polycrystalline layer; and
    performing a second clean step to remove the remaining out-diffusing dopant on the surface of the polycrystalline layer; and
    reducing a grain size of the polycrystalline layer so that a grain size of the polycrystalline layer ranges from 20 angstroms to 500 angstroms.

2. The method of claim 1, wherein the polycrystalline layer comprises a poly-Si layer.

3. The method of claim 2, wherein the first clean step uses hydrofluoric acid.

4. The method of claim 1, wherein the dopant comprises phosphorus.

5. The method of claim 4, wherein the second clean step uses hydrogen peroxide.

6. The method of claim 1, wherein the layer deposited on the polycrystalline layer comprises a SiN layer or a metal silicide layer.

* * * * *